(12) United States Patent
Moulard et al.

(10) Patent No.: US 10,097,152 B2
(45) Date of Patent: Oct. 9, 2018

(54) MEMS COMPONENT HAVING ALN AND SC AND METHOD FOR MANUFACTURING A MEMS COMPONENT

(71) Applicant: Snaptrack Inc., San Diego, CA (US)

(72) Inventors: Gilles Moulard, Munich (DE); Paul Muralt, La Sarraz (CH); Ramin Matloub, Pully (CH)

(73) Assignee: SnapTrack, Inc., San Diego, CA (US)

( * ) Notice: Subject to any disclaimer, the term of this patent is extended or adjusted under 35 U.S.C. 154(b) by 474 days.

(21) Appl. No.: 14/653,829

(22) PCT Filed: Dec. 21, 2012

(86) PCT No.: PCT/EP2012/076723
§ 371 (c)(1),
(2) Date: Jun. 18, 2015

(87) PCT Pub. No.: WO2014/094887
PCT Pub. Date: Jun. 26, 2014

(65) Prior Publication Data
US 2015/0333727 A1 Nov. 19, 2015

(51) Int. Cl.
*H01L 41/187* (2006.01)
*H03H 3/04* (2006.01)
(Continued)

(52) U.S. Cl.
CPC ............ *H03H 3/04* (2013.01); *H01L 41/187* (2013.01); *H01L 41/29* (2013.01); *H01L 41/314* (2013.01);
(Continued)

(58) Field of Classification Search
CPC ........... H03H 9/02007; H03H 9/02015; H03H 9/02031; H03H 9/171
(Continued)

(56) References Cited

U.S. PATENT DOCUMENTS 6,441,539 B1 8/2002 Kitamura et al.
2002/0121499 A1 9/2002 Bradley et al.
(Continued)

FOREIGN PATENT DOCUMENTS

DE 112010002790 T5 11/2012
JP 2001203558 A 7/2001
(Continued)

OTHER PUBLICATIONS

Ababneh, A., et al., "Etching behaviour of sputter-deposited aluminium nitride thin films in H3PO4 and KOH solutions," Microsystem Technologies—Micro and Nanosystems Information Storage and Processing Systems, vol. 14, No. 4-5, Jan. 29, 2008, pp. 567-573.
(Continued)

*Primary Examiner* — Derek Rosenau
(74) *Attorney, Agent, or Firm* — Patterson & Sheridan, L.L.P. Qualcomm

(57) ABSTRACT

A MEMS component includes a lower electrode. The MEMS component also includes an upper electrode. The upper electrode overlies the lower electrode. The MEMS component also includes a first piezoelectric layer between the lower electrode and the upper electrode. The first piezoelectric layer has a first piezoelectric material comprising AlN and Sc.

4 Claims, 4 Drawing Sheets

BAWR2

BAWR1

(51) Int. Cl.
*H01L 41/29* (2013.01)
*H01L 41/314* (2013.01)
*H01L 41/332* (2013.01)
*H03H 3/02* (2006.01)
*H03H 9/02* (2006.01)
*H03H 9/58* (2006.01)

(52) U.S. Cl.
CPC ............ *H01L 41/332* (2013.01); *H03H 3/02* (2013.01); *H03H 9/02015* (2013.01); *H03H 9/589* (2013.01); *H03H 2003/0435* (2013.01); *H03H 2003/0471* (2013.01)

(58) Field of Classification Search
USPC ......................................................... 310/320
See application file for complete search history.

(56) References Cited

U.S. PATENT DOCUMENTS

| | | | |
|---|---|---|---|
| 2002/0121840 A1* | 9/2002 | Larson, III | H03H 3/04 310/312 |
| 2002/0153965 A1 | 10/2002 | Ruby et al. | |
| 2005/0012568 A1 | 1/2005 | Aigner et al. | |
| 2008/0296529 A1 | 12/2008 | Akiyama et al. | |
| 2012/0104900 A1 | 5/2012 | Nishihara et al. | |
| 2012/0107557 A1 | 5/2012 | Akiyama et al. | |
| 2012/0293278 A1 | 11/2012 | Burak et al. | |
| 2012/0306591 A1 | 12/2012 | Nishihara et al. | |
| 2013/0127300 A1 | 5/2013 | Umeda et al. | |
| 2015/0381144 A1* | 12/2015 | Bradley | H03H 3/02 333/132 |

FOREIGN PATENT DOCUMENTS

| | | |
|---|---|---|
| JP | 2002359534 A | 12/2002 |
| JP | 2003022074 A | 1/2003 |
| JP | 2007335437 A | 12/2007 |
| JP | 2008041921 A | 2/2008 |
| JP | 2009010926 A | 1/2009 |
| JP | 2009201101 A | 9/2009 |
| JP | 2012100029 A | 5/2012 |
| JP | 2012253497 A | 12/2012 |
| JP | 2013128267 A | 6/2013 |
| JP | 2014030136 A | 2/2014 |

OTHER PUBLICATIONS

Akiyama, M., et al., "Enhancement of Piezoelectric Response in Scandium Aluminum Nitride Alloy Thin Films Prepared by Dual Reactive Cosputtering," Advanced Materials, vol. 21, Issue 5, Feb. 2, 2009, pp. 593-596.

Ho, G.K., et al., "Piezoelectric-on-Silicon Lateral Bulk Acoustic Wave Micromechanical Resonators," Journal of Microelectromechanical Systems, vol. 17, Vo. 2, Apr. 2008, 9 pages.

Jakkaraju, R., et al., "Integrated approach to electrode and AlN depositions for bulk acoustic wave (BAW) devices," Microelectronic Engineering, vol. 70, Nov. 2003, pp. 566-570.

Moreira, M., et al., "Aluminum scandium nitride thin-film bulk acoustic resonators for wide band applications," Vacuum, vol. 86, Issue 1, Jul. 4, 2011, pp. 23-26.

Tadigadapa, S., "Piezoelectric Microelectromechanical Systems—Challenged and Opportunities," Procedia Engineering, Proc. Eurosensors XXIV, vol. 5, Sep. 5-8, 2010, pp. 468-471.

Trolier-McKinstry, S., et al., "Thin Film Piezoelectrics for MEMS," Journal of Electroceramics, vol. 12, Jan. 2004, pp. 7-17.

Yanagitani, T. et al.: "(0001) ScAlN Piezoelectric Film Resonators Fabricated by Sputtering of Sc Grain Ingot," The Japan Society of Applied Physics, The 59th Spring Meeting, 18p-C3-1, Mar. 18, 2012, WASEDA University.

International Search Report and Written Opinion—PCT/EP2012/076723—ISA/EPO—dated Oct. 29, 2013.

* cited by examiner

MEMS COMPONENT HAVING ALN AND SC AND METHOD FOR MANUFACTURING A MEMS COMPONENT

This patent application is a national phase filing under section 371 of PCT/EP2012/076723, filed Dec. 21, 2012, which is incorporated herein by reference in its entirety.

TECHNICAL FIELD

The present invention refers to MEMS components, e.g., BAW components or piezoelectric switches, and to methods for manufacturing such components.

BACKGROUND

The present trend towards miniaturization of mobile communication devices demands for smaller electric and electroacoustic components. BAW (BAW=bulk acoustic wave) components can be used in RF filters, e.g., in duplexers in front-end modules of mobile communication devices. A duplexer usually comprises a TX (transmission) and an RX (reception) filter. The TX filter and the RX filter are bandpass filters with adjacent but different pass bands. An important factor determining the pass band of a BAW band-pass filter is the thickness of piezoelectric material arranged between two electrode layers of a resonator of the filter and the mass loading of a resonator.

Conventional piezoelectric materials are $LiTaO_3$ (Lithiumtantalate), $LiNbO_3$ (Lithiumniobate), quartz or AlN (aluminium nitride). It is of advantage if the piezoelectric material used for improved MEMS components allows a higher electroacoustic coupling coefficient $\kappa^2$ or has higher piezoelectric coefficients compared to conventional materials. However, handling such materials is more difficult, and novel methods and processing steps are needed to obtain improved components with unconventional piezoelectric materials such as Sc (Scandium)-doped AlN due to the different physical and chemical properties of Sc-doped AlN.

One type of conventional BAW duplexers has different piezoelectric material thicknesses for the TX filter and for the RX filter. Accordingly, the two filters are manufactured by means of different processes and on different carrier chips.

Another type of conventional BAW duplexers has additional mass, e. g. additional layers on the upper electrode, deposited on selected resonators to reduce their respective resonance frequency.

The manufacturing methods for both types are relatively complex, expensive and susceptible to errors. In particular, conventional duplexers have TX and RX filters on different carrier chips, which is contrary to the miniaturization efforts.

SUMMARY

What is needed is an improved MEMS component where two BAW layer stacks can be easily arranged on the same chip to obtain a miniaturized BAW filter and where the composition of the component allows improved manufacturing methods to increase the gain of good components. What is further needed is a method for manufacturing such a component.

A MEMS component comprises a lower electrode and an upper electrode above the lower electrode. The component further comprises a first piezoelectric layer between the lower electrode and the upper electrode. The first piezoelectric layer has a first piezoelectric material comprising AlN and Sc.

Such a MEMS component can provide better electromechanical, e.g., electroacoustic, properties compared to conventional components. Surprisingly, it was found that MEMS components with AlN and Sc in their piezoelectric layer can be manufactured in good quality although conventional methods for manufacturing may not allow a product quality good enough for mass production.

In one embodiment, the MEMS component is a BAW resonator and the piezoelectric material is Sc-doped AlN.

The BAW resonator has a lamination comprising the upper and the lower electrode and the piezoelectric layer. The lamination is arranged within the component in such a way that an acoustic resonance with bulk acoustic waves can propagate through the lamination or in such a way that a standing acoustic wave can be established at least partially in the lamination. Therefore it is possible that the lamination is arranged onto or above an acoustic minor or above a cavity. The mirror or the cavity helps confining acoustic energy in the lamination to establish resonance.

It was found that the piezoelectric material can be Sc-doped AlN ($Sc_xAl_{(1-y)}N$) with a doping level of approx. $1\% <= x <= 25\%$ and y being equal or mainly equal to x. Especially a level of approx. $5\% <= x <= 7\%$ is possible.

A MEMS component with Sc and AlN in a piezoelectric layer can benefit from the good piezoelectric properties of such materials. Etching agents for structuring such materials were found, too. With such materials it is possible to create BAW resonators of different resonance frequencies on the same carrier. A BAW resonator having a lower resonance frequency than another resonator can have an additional piezoelectric layer between the electrode layers.

In one embodiment of the MEMS component, the lower electrode, the first piezoelectric layer and the upper electrode form part of a first BAW resonator. The component further comprises a second BAW resonator with a lower electrode, an upper electrode and a second piezoelectric material in a second piezoelectric layer between the electrodes of the second BAW resonator. The second piezoelectric material comprises AlN or a different piezoelectric material.

The second piezoelectric material can be pure AlN or doped, e.g., Sc-doped, AlN. The doping level of the second piezoelectric material can equal the doping level of the first piezoelectric material. However, a different doping level is also possible.

In a variation of the above-described embodiment, the second piezoelectric material comprises GaAs (gallium arsenide), ZnO (zinc oxide), PZT (lead zirconate titanate), KNN (($K_{(1-x)}Na_x$)$NbO_3$) (with K: Kalium, Na: Sodium, Nb: Niobium, O: Oxygen).

In one embodiment, the second piezoelectric material has a different etching rate by a phosphoric acid solution compared to Sc-doped AlN.

In one embodiment, the second piezoelectric material is Sc-doped AlN.

It is possible that the thicknesses of the first piezoelectric layer and of the second piezoelectric layer are equal.

In one embodiment, the thickness of the first piezoelectric layer differs from the thickness of the second piezoelectric layer. Especially, the thickness of the first piezoelectric layer can be bigger or smaller than the thickness of the second piezoelectric layer.

Then, a BAW component with two resonators and different thicknesses of respective piezoelectric layers is obtained. Such a component can be an RF filter where different thicknesses allow different resonance frequencies. Different resonance frequencies may be required, for example, in series resonators and in parallel resonators of a ladder-type filter structure to establish a band-pass filter or a band-rejection filter. Different resonance frequencies, e.g., for different pass bands or different rejection bands, can be needed in a Diplexer or a Duplexer.

BAW structures and further variants, e.g., MEMS components comprising lever structures, are possible. For instance, the component can comprise a piezo MEMS switch. A component with more than one switch is also possible. In an embodiment comprising two switches, both switches can be made on a single carrier chip. The first cantilever can have one piezoelectric layer while the second cantilever has two piezoelectric layers. Therefore, it is possible to process, on the same chip, two switches having two different closing voltages.

In addition to the mentioned layers, further layers, e.g., seed layers, adhesion layers, passivation layers, further piezoelectric layers or anti-acoustomigration layers, can be present between the electrode layers and piezoelectric layers.

The use of Sc-doped AlN, thus, allows MEMS components with improved electromechanical properties, while— as found by the inventors—the MEMS components can be manufactured with a good component quality and by means of manufacturing steps that are not more complex than the manufacturing steps used for conventional components as described below.

A method for manufacturing a MEMS component comprises the steps of
 providing a carrier substrate,
 depositing a lower electrode onto or above the carrier substrate,
 depositing a first piezoelectric layer with Sc-doped AlN onto or above the lower electrode,
 structuring the first piezoelectric layer,
 depositing an upper electrode onto or above the first piezoelectric layer.

Then, the lower electrode, the first piezoelectric layer and the upper electrode form a first electromechanical active layer stack.

It was found that a piezoelectric layer comprising Sc-doped AlN can be structured despite the different physical and chemical properties of Sc-doped AlN compared to conventional materials such as pure AlN. Especially a phosphoric acid based solution can be utilized to etch, and therefore structure, Sc-doped AlN.

However, other etching agents, e.g., based on acetic acid, nitric acid or fluoride acid are also possible.

The concentration of the etching agent can be between 20% and 85%.

An 80% phosphoric acid solution can yield good results.

In one embodiment of the method, structuring the piezoelectric layer can take place at a temperature between 25° Celsius and 85° Celsius. The temperature can be around 70° Celsius, for example. The etch rate can be approx. 100 nm per minute or higher or lower, depending on the temperature or on the concentration.

Thus, a method for structuring Sc-doped AlN exists that is easy to perform and that allows altering the thickness of a piezoelectric layer with Sc and AlN of one electromechanical active structure. If the component comprises another, unaltered layer in another structure, then different structures can be obtained within the same MEMS component.

Thus, in one embodiment, a second layer stack with a second piezoelectric layer is arranged next to the first layer stack. The second piezoelectric layer is not structured while the first piezoelectric layer is.

It is possible that both layer stacks are structured together, e.g., with the same etching agent, but for example, with different etching rates.

The second piezoelectric layer can comprise AlN or different piezoelectric material. Especially the second piezoelectric layer can comprise Sc-doped AlN, which may be covered with a resist layer, while the first piezoelectric layer is structured.

In one embodiment, a phosphoric acid solution is utilized to structure the first piezoelectric layer.

BRIEF DESCRIPTION OF THE DRAWINGS

Examples of MEMS components and their manufacturing methods and the respective working principles are shown in the schematic figures.

DETAILED DESCRIPTION OF ILLUSTRATIVE EMBODIMENTS

Figure 1:
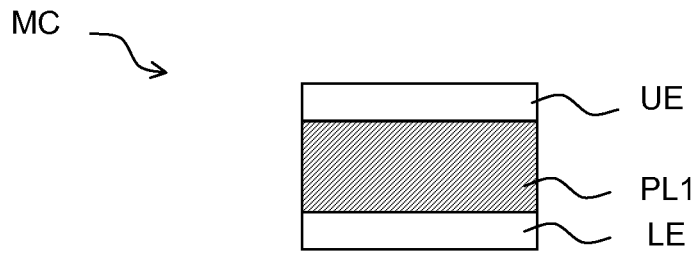
FIG. 1 shows a basic MEMS component with a piezoelectric layer PL1 between two electrode layers LE, UE.

FIG. 1 shows a MEMS component MC comprising a first piezoelectric layer PL1 between a lower electrode LE and an upper electrode UE. The first piezoelectric layer PL1 comprises the first piezoelectric material with AlN and Sc. This allows for a high-quality MEMS component with a structured first piezoelectric layer PL1, as methods for structuring Sc and AlN comprising piezoelectric material were found.

Figure 2:
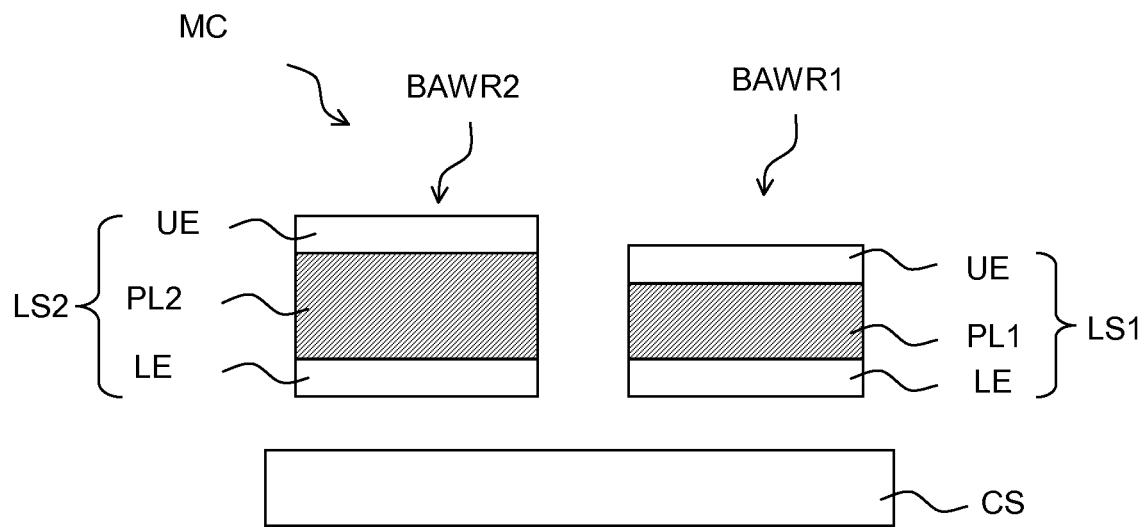
FIG. 2 shows a MEMS component with two BAW resonator stacks.

FIG. 2 shows a MEMS component MC where a first BAW resonator BAWR1 is arranged next to a second BAW resonator BAWR2. Both resonators can be arranged on or above a carrier substrate CS. Both resonators comprise a lower electrode LE and an upper electrode UE. At least the first BAW resonator BAWR1 comprises a first piezoelectric material. Piezoelectric layers PL1, PL2 and the electrodes LE, UE establish a first lamination LS1 and a second lamination LS2 of the resonator, respectively, in which an acoustic wave is excited when an RF signal is applied to the respective electrodes. The piezoelectric layer PL2 of the second BAW resonator BAWR2 is thicker than the piezoelectiric layer PL1 of the first resonator BAWR1. Thus, both resonators have different resonance frequencies although they can be manufactured by means of easy-to-perform manufacturing steps one next to the other on or above a common carrier substrate CS.

Figure 3:
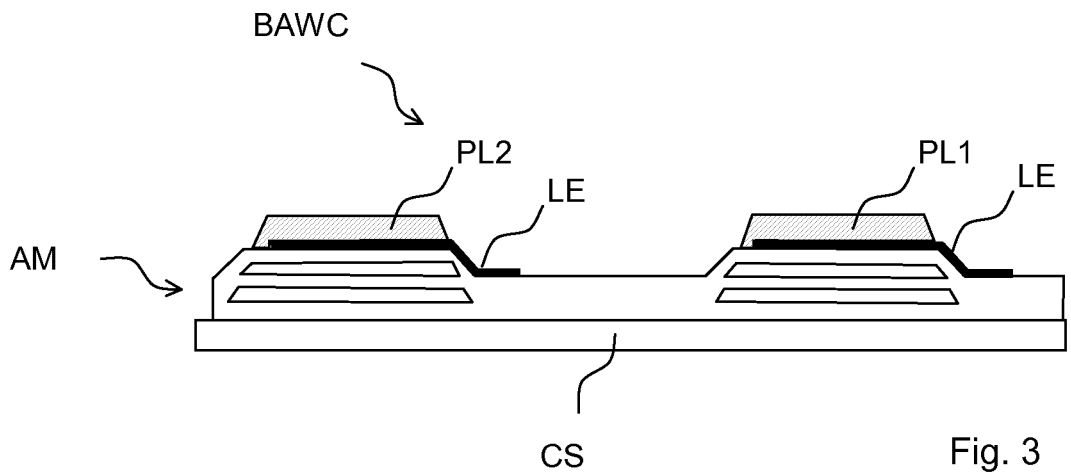
FIG. 3 shows elements of a BAW component comprising acoustic minors.

FIG. 3 shows main components of a BAW component BAWC where mainly the top electrode is omitted. Two resonator stacks are arranged on respective acoustic mirrors AM. The acoustic minors AM comprise a layer system with alternating high and low acoustic impedance. The acoustic minor AM confines acoustic energy and allows establishing a resonance mode of the respective resonator.

Figure 4:
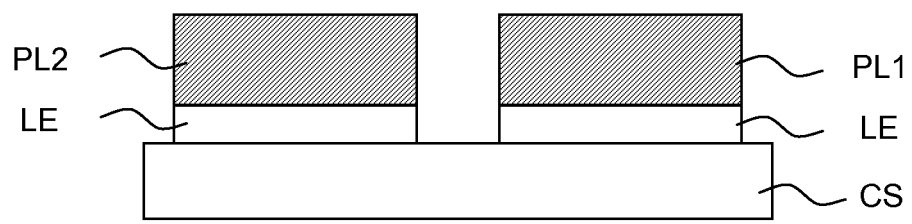
FIG. 4 shows a stage of a manufacturing process.

FIG. 4 shows a stage during one of several possible manufacturing processes where two layer stacks are arranged next to each other on a common carrier substrate CS. After depositing and structuring a lower electrode LE, the first piezoelectric layer PL1 is deposited and structured on the lower electrode LE of at least one layer stack.

Figure 5:
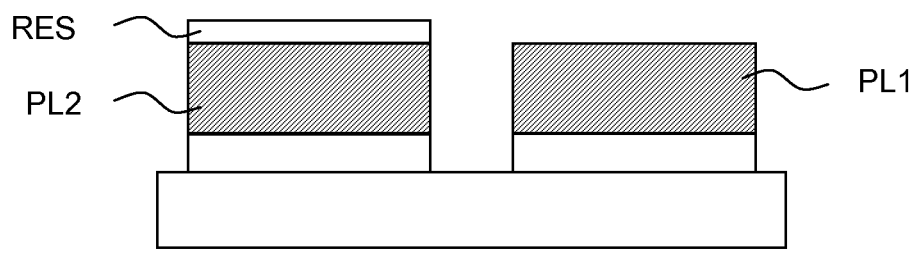
FIG. 5 shows a stage of a manufacturing process.

FIG. 5 shows an optional stage of a manufacturing process where a resist layer RES is arranged on the second piezoelectric material. If the first and the second piezoelectric materials have the same composition, an etching agent will etch both materials at the same rate. If the layer thicknesses are to be different, one stack, i.e. the stack with the second piezoelectric material, may be covered with the resist layer RES. If the two piezoelectric materials are of different composition, a different etching rate can be obtained and no resist layer is needed to obtain different thicknesses.

Figure 6:
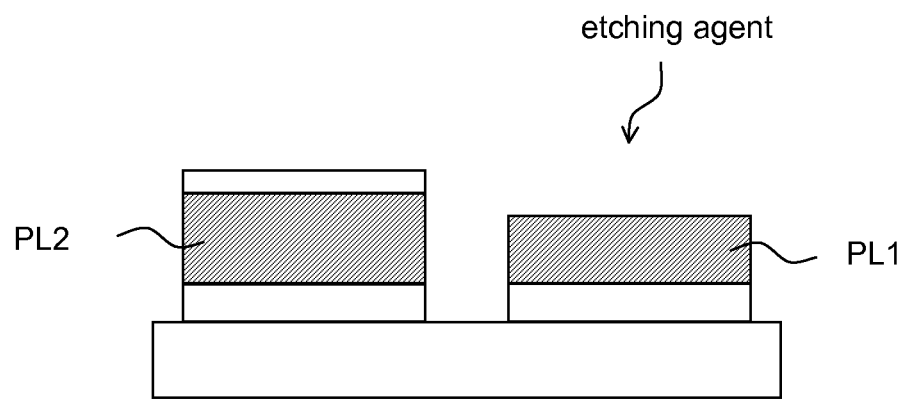
FIG. 6 shows a stage of a manufacturing process.

Accordingly, FIG. 6 shows a stage during which a difference in layer thickness is obtained by etching the first piezoelectric layer PL1.

Although it is in principle possible to adjust the thicknesses by etching it is preferred to adjust the thicknesses by depositing material. To obtain different thicknesses one layer stack can have an additional layer. Then, phosphoric acid can be used to structure resonator stacks comprising Sc and AlN.

Figure 7:
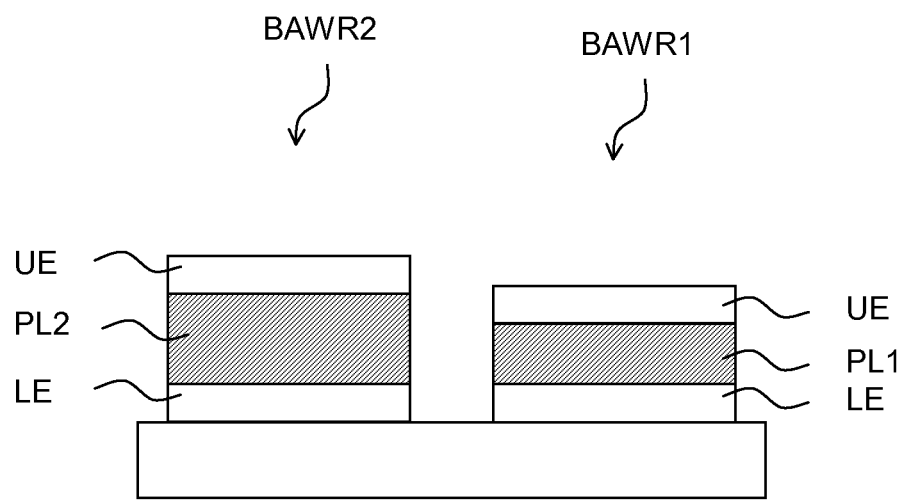
FIG. 7 shows a final stage of a manufacturing process.

FIG. 7 shows a final manufacturing stage where an upper electrode UE has been deposited and structured on both layer stacks to yield respective BAW resonators BAWR1, BAWR2.

Figure 8:
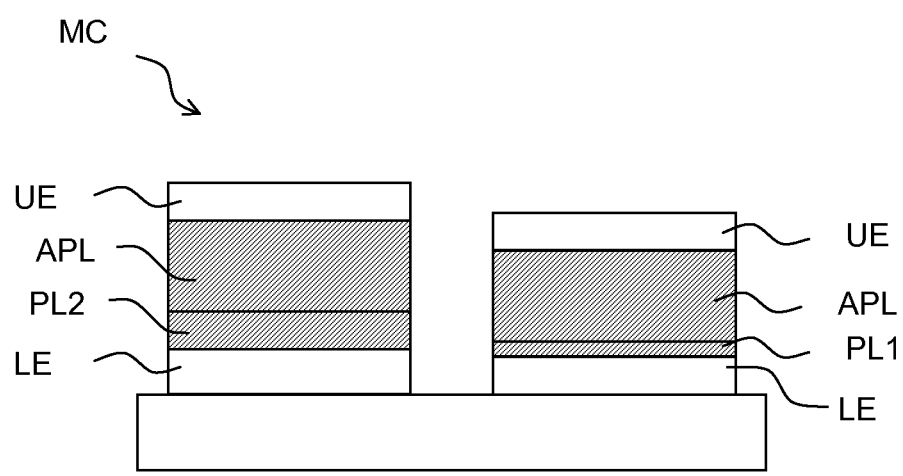
FIG. 8 shows a component with piezoelectric switches with different thicknesses of piezoelectric material.

FIG. 8 shows another embodiment of the MEMS component where additional piezoelectric layers APL are arranged between the first PL1 and the second piezoelectric layer PL2, respectively, on one side and the upper electrode UE on the other side. A difference in the thickness of the piezoelectric material is obtained by providing a thickness difference between the first PL1 and the second PL2 piezoelectric layers.

Figure 9:
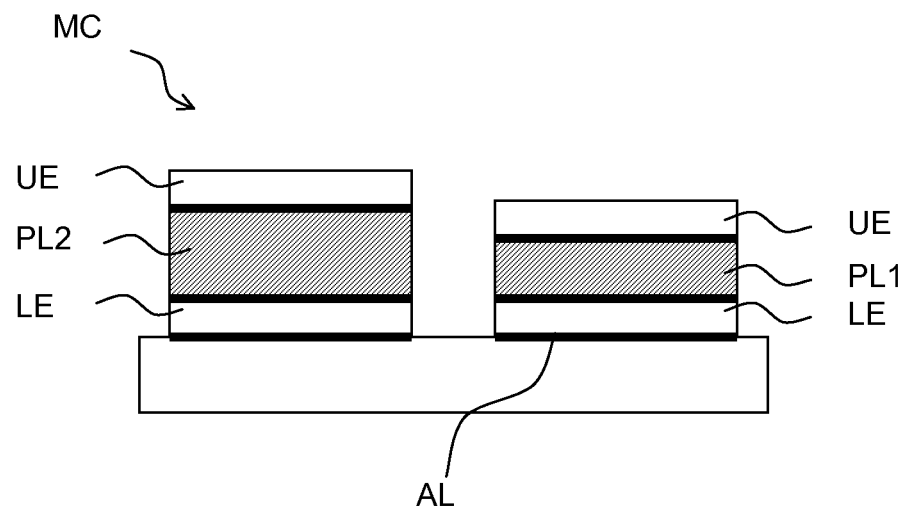
FIG. 9 shows a component with further layers.

FIG. 9 shows an embodiment of the MEMS component where additional layers AL are arranged between the piezoelectric and/or electrode layers. One or more additional layers AL can be seed layers, adhesion layers, passivation layers, further piezoelectric layers or anti-acoustomigration layers.

Figure 10:
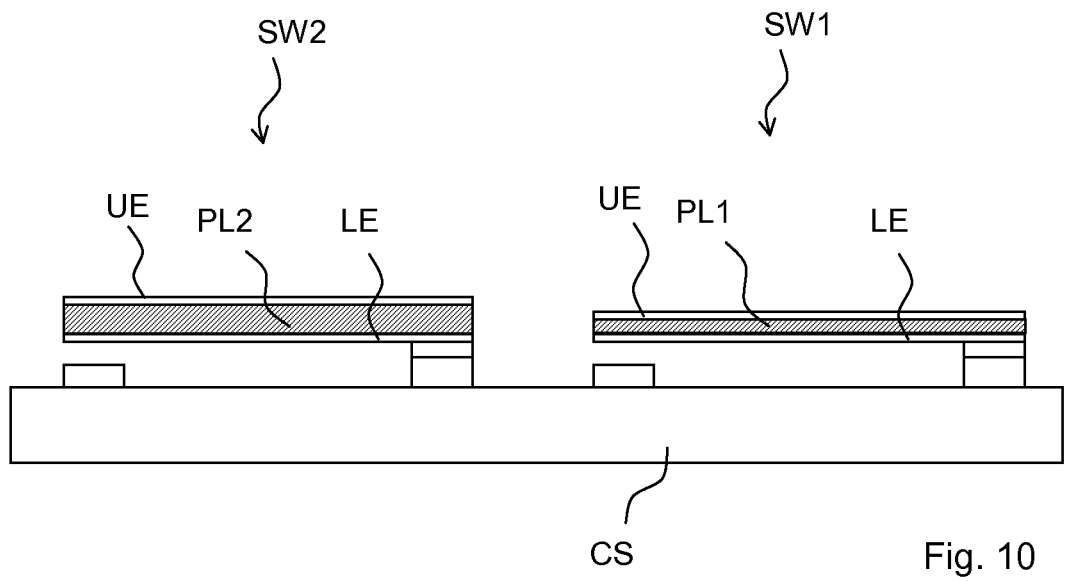
FIG. 10 shows a component with piezoelectric switches with different closing voltages.

FIG. 10 shows a BAW component where a lamination comprising a first piezoelectric layer PL1 and a second piezoelectric layer PL2 are each arranged between a respective lower electrode LE upper electrode UE to establish a first cantilever-shaped switch SW1, and a second cantilever-shaped switch SW2. The switches are arranged next to each other on the same carrier substrate. The different constructions of the two switches allow different closing voltages.

Neither the MEMS component nor the method for manufacturing such a MEMS component are limited to the embodiments described in the specification or shown in the figures. Components and methods comprising further materials or layers or components comprising further resonators or methods comprising further deposition steps or etching steps or combinations thereof are also covered by the present invention.

The invention claimed is:

1. A MEMS component comprising:
a first lower electrode on a substrate;
a first upper electrode overlying the first lower electrode;
a first piezoelectric layer between the first lower electrode and the first upper electrode, wherein the first piezoelectric layer comprises Sc-doped AlN;
a second lower electrode on the substrate;
a second upper electrode overlying the second lower electrode; and
a second piezoelectric layer between the second lower electrode and the first lower electrode, wherein the second piezoelectric layer is thicker than the first piezoelectric layer, and wherein the second piezoelectric layer has a different material composition than the first piezoelectric layer.

2. The MEMS component of claim 1, wherein
the first lower electrode, the first piezoelectric layer and the first upper electrode form part of a first BAW resonator; and
the second lower electrode, the second upper electrode and the second piezoelectric layer form a part of a second BAW resonator.

3. The MEMS component of claim 2, wherein the second piezoelectric layer comprises AlN.

4. The MEMS component of claim 2, wherein the second piezoelectric layer has an etching rate for a phosphoric acid solution that is different from an etching rate of the first piezoelectric layer for the phosphoric acid solution.

* * * * *